United States Patent [19]
Teng

[11] Patent Number: 5,913,721
[45] Date of Patent: Jun. 22, 1999

[54] VENTILATION HOOD WITH ENHANCED PARTICLE CONTROL AND METHOD OF USING

[75] Inventor: Kuo Hsiu Teng, Chung-Ho, Taiwan

[73] Assignee: Taiwan Semiconductor Manufacturing Co. Ltd., Hsin Chu, Taiwan

[21] Appl. No.: 09/055,379

[22] Filed: Apr. 6, 1998

[51] Int. Cl.⁶ .................................................. B08B 15/02
[52] U.S. Cl. ................................ 454/66; 134/21; 134/902
[58] Field of Search .................................. 454/49, 56, 63, 454/64, 66, 67, 187; 134/902, 21

[56] References Cited

U.S. PATENT DOCUMENTS

| | | | |
|---|---|---|---|
| 4,755,844 | 7/1988 | Tsuchiya et al. | 134/902 X |
| 5,522,412 | 6/1996 | Ohba et al. | 134/902 X |

FOREIGN PATENT DOCUMENTS

| | | | |
|---|---|---|---|
| 1-181519 | 7/1989 | Japan | 134/902 |
| 64-131026 | 10/1989 | Japan | 134/902 |
| 3-234021 | 10/1991 | Japan | 134/902 |
| 4-152525 | 5/1992 | Japan | 134/902 |

*Primary Examiner*—Harold Joyce
*Attorney, Agent, or Firm*—Tung & Associates

[57] ABSTRACT

An apparatus for cleaning a process chamber that includes a ventilation hood which has a fluid flow channel attached to an inner peripheral wall of the hood body equipped with a plurality of fluid nozzles pointing downwardly toward a process chamber cavity when the hood is positioned on such process chamber, and a method for using the apparatus. A purge gas flown through the fluid nozzles carries substantially all contaminating fumes or particles away from the process chamber cavity into an air evacuation system such as a factory vacuum exhaust system such that contamination of the process chamber can be essentially eliminated.

20 Claims, 2 Drawing Sheets

VENTILATION HOOD WITH ENHANCED PARTICLE CONTROL AND METHOD OF USING

FIELD OF THE INVENTION

The present invention generally relates to a ventilation hood for use in cleaning a chemical process chamber and a method of using such hood and more particularly, relates to a ventilation hood for use in wet cleaning a semiconductor process chamber which has enhanced particle control by built-in fluid flow channels inside the hood and a method of using such hood.

BACKGROUND OF THE INVENTION

In the fabrication of semiconductor integrated circuit (IC) devices, various device features such as insulation layers, metallization layers, passivation layers, etc., are formed on a semi-conducting substrate. It is known that the quality of an IC device fabricated is a function of the processes in which these features are formed. The yield of an IC fabrication process is in turn a function of the quality of the device fabricated and a function of the cleanliness of the manufacturing environment in which the IC device is processed.

The ever increasing trend of miniaturization of semiconductor IC devices occurring in recent years requires more stringent control of the cleanliness in the fabrication process or the processing chamber in which the process is conducted. This leads to a more stringent control of the maximum amount of impurities and contaminants that are allowed in a process chamber. When the dimension of a miniaturized device approaches the sub-half-micron level, even a minutest amount of contaminants can significantly reduce the yield of the IC manufacturing process. For instance, the yield of the process can be drastically reduced by the presence of contaminating particles during deposition or etching of films which leads to the formation of voids, dislocations or short-circuits resulting in performance and reliability problems in the IC devices fabricated.

In recent years, contamination caused by particles or films has been reduced by the improvements made in the quality of clean rooms and by the increasing utilization of automated equipment which are designed to minimize exposure to human operators. However, even though contaminants from external sources have been r educed, various contaminating particles and films are still generated inside the process chamber during processing of semiconductor wafers. Some possible sources of contamination that have been identified include the process gases and liquids, the interior walls of the process chambers and the mechanical wear of the wafer handling equipment.

The chances of generating contaminating particles are also increased in process chambers that are equipped with plasma enhancement. Various chemically reacted fragments are generated from the processing gases which include ions, electrons and radicals. These fragments can combine and form negatively charged particles which may ultimately contaminate a substrate that is being processed in the chamber. Various other materials, such as polymeric films may be coated on the process chamber walls during plasma processing. The films may dislodge and fall from the process chamber walls when subjected to mechanical and thermal stresses onto the wafers that are being processed in the chamber.

Conventionally, a wet cleaning process must be conducted in a semiconductor process chamber as part of a preventive maintenance schedule. For instance, in a chemical vapor deposition (CVD) chamber, a preventive maintenance schedule which included a wet cleaning is conducted on a monthly basis. The wet cleaning process can be carried out by using cleaning solvents such as IPA (isopropyl alcohol), deionized water, IPA/deionized water mixture, or the more volatile acetone. A wet cleaning process is time consuming and generally hazardous to a maintenance personnel who carries out the process due to the toxic nature of the residual reactant gases, the reaction by-products and the cleaning solvent used. For instance, in a wet cleaning process for a chemical vapor deposition chamber that was utilized for depositing tungsten plugs, the cleaning procedure must be carefully carried out due to the toxic nature of tungsten fluoride reactant gas used in the chamber and the possibility of encountering residual reactant gas during the cleaning process.

Similarly, in a process chamber for depositing high temperature films (HTF), highly toxic reactant gases are also used which make the chamber cleaning process a hazardous task. In these process chambers, the contaminating substances may be in the form of either particulates or fumes. For instance, in a semiconductor process chamber, the particulate sources may include silicon dust, quartz dust, atmospheric dust, and particles originating from clean room personnel and processing equipment. Some of the examples of fume contaminants are solvent residues such as from acetone, isopropyl alcohol, methyl alcohol, xylene, photoresist developer residues from dissolved photoresist materials, oil fumes introduced through improperly filtered air or gas lines, metallic etchant or photoresist strip baths.

In a conventional process for wet cleaning a process chamber, a ventilation hood that is made of an opaque or metallic material is placed over an open process chamber for ventilation of the toxic or hazardous fumes from the process chamber. The ventilation hood is normally connected to a facility vacuum source such that hazardous fumes are exhausted away from the maintenance personnel for safety reasons. A typical wet cleaning process can be carried out in the following manner. In a monthly preventive maintenance procedure conducted in a CVD chamber for tungsten plugs, a ventilation hood is first placed on top of an open process chamber which is connected to a facility vacuum for a time period of at least one hour to evacuate the hazardous fumes in the process chamber. After the evacuation time of at least one hour, or preferably between one and two hours, a wet cleaning of the chamber is conducted by using a cleaning solvent such as IPA. To improve the cleaning efficiency, an air gun is used simultaneously during the evacuation process by the facility vacuum to blow dry nitrogen into the chamber cavity such that contaminating particles or films may be dislodged from the chamber walls and be evacuated away by the facility vacuum. In order to blow dry nitrogen into the chamber cavity, an access door must be provided in the hood body such that a maintenance personnel may operate an air gun through the access door to reach inside the chamber cavity. This is both a time consuming and hazardous task for the operator due to the danger of possible exposure to any toxic components in the exhausted fumes, even though the process is essential before a wet cleaning can be carried out.

It is therefore an object of the present invention to provide a ventilation hood for use in cleaning a process chamber that does not have the drawbacks or shortcomings of the conventional ventilation hoods.

It is another object of the present invention to provide a ventilation hood equipped with an access door for cleaning a process chamber that does not require the manual operation of an air gun inside the hood by an operator and thereby eliminating the risk of exposure to hazardous components of the exhaust.

It is a further object of the present invention to provide a ventilation hood that can be used effectively to remove hazardous fumes and contaminating particles from a process chamber prior to conducting a wet cleaning process on the chamber.

It is another further object of the present invention to provide a ventilation hood for use in cleaning a process chamber prior to a wet cleaning process that is constructed of a substantially clear material such that the cleaning process can be visually observed.

It is yet another object of the present invention to provide a ventilation hood that is equipped with an access door such that the maintenance of accessories inside a process chamber can be carried out if necessary.

It is still another object of the present invention to provide a ventilation hood for use in cleaning a process chamber that is equipped with a fluid flow channel system and fluid nozzles inside the hood.

It is still another further object of the present invention to provide a ventilation hood for use in cleaning a process chamber that is equipped with a fluid flow channel and fluid nozzles inside the hood such that a purge gas can be flown through the hood and the process chamber to carry away contaminating particles.

It is yet another further object of the present invention to provide a method for venting a process chamber prior to a wet cleaning process by flowing into the hood and the process chamber a purge gas simultaneously with the vacuum evacuation process such that substantially all contaminating particles are removed from the chamber.

SUMMARY OF THE INVENTION

In accordance with the present invention, a ventilation hood with enhanced particulate control by utilizing a fluid flow channel and nozzles inside the hood and a method for using hood are provided.

In a preferred embodiment, an apparatus for cleaning a process chamber is provided which includes a ventilation hood that has a hood body, the body has an open bottom and a reduced opening top, the open bottom is adapted to sealingly engage an open top of a process chamber, a fluid flow channel attached to an inner peripheral wall of the hood body equipped with a plurality of fluid nozzles pointing substantially downwardly toward the process chamber when the ventilation hood is positioned on the chamber, a fluid reservoir in communication with the fluid flow channel for supplying a purge fluid through the plurality of fluid nozzles, and an exhaust system in communication with the reduced opening top of the hood body for removing an effluent from the process chamber after the chamber is purged by the fluid. The ventilation hood body may further include an observation means through the body which may be a substantially clear hood body or an access door made of a substantially clear material. The process chamber may be a semiconductor process chamber wherein the fluid flow channel is adapted for transporting a gas or a liquid therethrough. The plurality of fluid nozzles are adapted for injecting a purge gas toward the process chamber for transporting contaminating particles into the exhaust system for the hood. The apparatus may further include a fluid shut-off device in communication with and in-between the fluid reservoir and the fluid flow channel.

In another preferred embodiment, the present invention also provides a method for venting a process chamber prior to a wet cleaning process by removing effluent contaminating particles which can be carried out by the operating steps of first providing a process chamber which has an open top, then providing a ventilation hood which has a hood body equipped with an open bottom and a reduced opening top, a fluid flow channel attached to an inner peripheral wall of the hood body equipped with a plurality of fluid nozzles and an exhaust system in fluid communication with the reduced opening top of the hood, then sealingly engaging the open bottom of the hood body with the open top of the process chamber, and then flowing a fluid into the fluid flow channel through the plurality of fluid nozzles forming an effluent contaminating particles into the exhaust system. The method may firer include the step of cleaning the inside walls of the process chamber with a solvent after the fluid is flown through the fluid flow channel. The method may further include the step of flowing a fluid through the plurality of fluid nozzles continuously for a time period of not less than 3 minutes. Alternatively, the method may include the step of flowing the fluid through the plurality of fluid nozzles intermittently for at least three times and at least one minute each time. The fluid flown through the plurality of fluid nozzles can be nitrogen or compressed dry air. The method may further include the step of visually observing the cleaning process through an observation means installed in the hood body. The method may further include the step of opening a shut-off valve connected in fluid communication with and in-between the fluid flow channel and a fluid reservoir. The fluid flows through the plurality of fluid nozzles under a pressure of between about 30 psi and about 150 psi.

The present invention further provides an apparatus for venting a process chamber prior to a chamber wet cleaning process which includes a ventilation hood that has a hood body, the hood body is equipped with an open bottom, a reduced opening top and an observation means, the open bottom is adapted for sealingly engaging an open top of a process chamber, a gas flow channel attached to an inner peripheral wall of the hood body equipped with a plurality of gas nozzles. A gas supply line connected to the gas flow channel for supplying a purge gas through the gas nozzles, and a gas evacuation means that is connected to the reduced opening top of the hood body for removing the purge gas from the process chamber. The observation means may include a hood body that is substantially, optically transparent. The purge gas utilized may be nitrogen or compressed dry air. The apparatus may further include a fluid shut-off device that is connected in fluid communication with and in-between the gas supply line and the gas flow channel.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
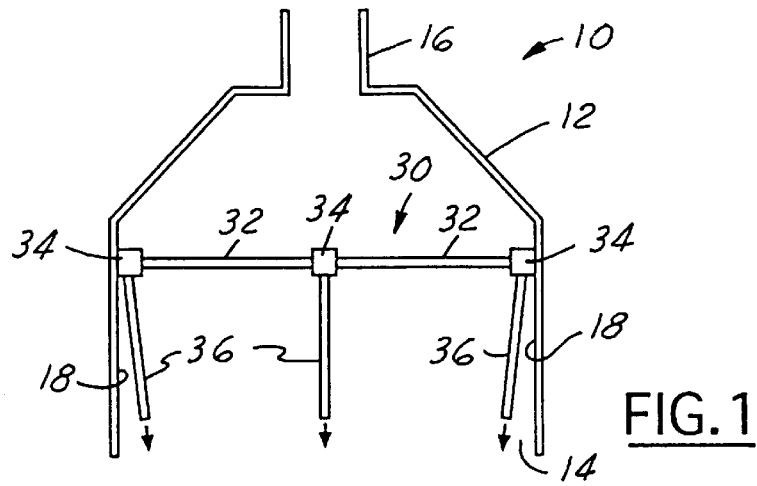
FIG. 1 is a cross-sectional view of the present invention ventilation hood equipped with a fluid flow channel system.

The present invention discloses a ventilation hood that is used for cleaning a process chamber and is equipped with a fluid flow channel attached to an inner peripheral wall of the hood body and a plurality of fluid nozzles pointing downwardly toward a process chamber when the ventilation hood is positioned thereon such that contaminating particles in the process chamber are carried out by a purge gas flown into the chamber through the fluid nozzles into a facility vacuum exhaust system attached to an outlet of the hood.

In the ventilation hood, a fluid flow channel of gas tubes is mounted to the inside wall of the hood surrounding the hood interior peripheral surface. In a preferred embodiment, a total of eight fluid nozzles are mounted to the fluid flow channel such that a purge gas of general nitrogen or compressed dry air may be flown through the nozzles to either loosen the contaminating films or particles on the chamber walls or those in the chamber cavity such that the particles or films are carried away into the facility vacuum exhaust system. A manual shut-off valve or an automatic shut-off valve controlled by the process machine microprocessor may be mounted outside the ventilation hood in-between the fluid flow channel and a fluid supply line or a fluid reservoir. In the case when a general nitrogen gas is used, the shut-off valve may be connected to a facility nitrogen supply line or a nitrogen supply tank. The purge gas is capable of removing contaminating particles in the chamber cavity and thus reducing the contamination of the clean room environment. The present invention novel ventilation hood therefore not only performs an original function of the hood by exhausting hazardous fumes from inside the chamber cavity, but also performs a chamber cleaning function by reducing contaminating particles in the chamber cavity.

The ventilation hood of the present invention can be advantageously made of a transparent or translucent plastic material. For instance, polymethylmethacrylate (Plexiglass®) or polycarbonate (Lexan®) can be advantageously used. A transparent hood body affords the convenience of observation by a maintenance personnel of the hood interior and the chamber cavity during a cleaning process. The present invention ventilation hood may also be made by any other material that may not be optically transparent. When such materials are used, an observation door, or an access door made of a transparent or a translucent material may be provided on a front panel of the hood. The observation door allows a machine operator to observe through the door the hood interior and the chamber cavity, and furthermore, provides easy access to the chamber interior should additional cleaning by hand becomes necessary. For instance, it may become necessary for the operator to wipe the interior walls of the process chamber with solvents such as IPA or acetone. The access door may also be used for additional purge operation by an operator using an air gun when the purge gas fed from the fluid flow channel is insufficient. The top of the ventilation hood, having a reduced opening, is normally formed in a tapered section providing an outlet for connecting to an air evacuation system such as a factory vacuum exhaust system. After such connection is made, a shut-off valve connected between the fluid flow channel and the fluid supply line may be turned on to purge the chamber interior. The purging process may be carried out in a continuous, i.e., for a time period of not less than 3 minutes, and preferably for a time period of not less than 10 minutes. The purging operation may also be conducted in an intermittent manner wherein the purge gas is turned on at least three times for one minute each time.

The purge gas used in the present invention novel method can be conveniently a general nitrogen gas, a dry nitrogen gas, or a compressed dry air. Other inert gases such as argon or helium may also be suitably used, even though at substantially higher cost. Next to the shut-off valve, which is either a manual type or an automatic type controlled by the machine microprocessor, is mounted a quick connector valve for easy connection to a factory gas supply line or to a gas supply tank. A suitable gas pressure to be used is approximately between about 60 psi and about 80 psi for general nitrogen. A suitable material used for the fluid flow channel and the fluid nozzles is Teflon® for its superior chemical and corrosion resistance. After the process chamber cavity is purged by the purge gas and any hazardous fumes or particles inside the chamber are exhausted away, the ventilation hood is removed from the process chamber so that a wet cleaning process of the chamber can be carried out.

Figure 2:
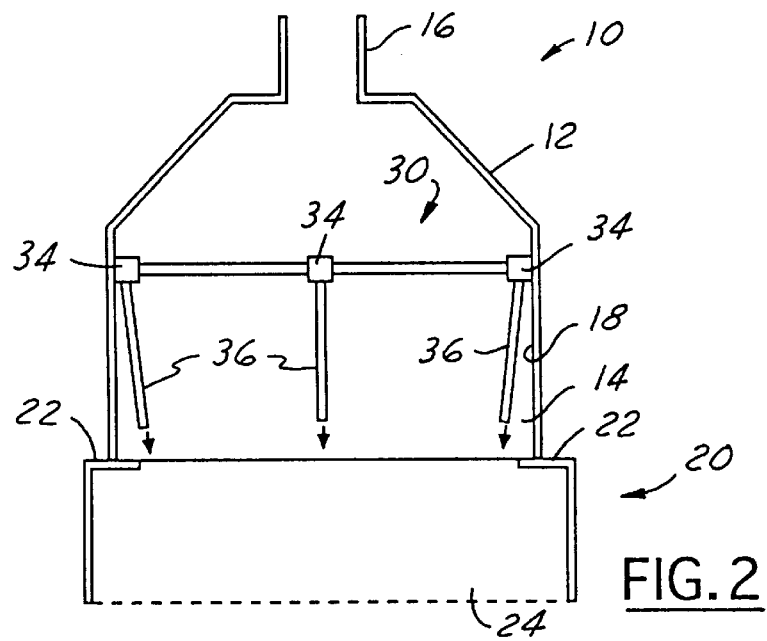
FIG. 2 is a cross-sectional view of the present invention ventilation hood that is placed in intimate contact with an open top of a process chamber.

Referring initially to FIG. 1, wherein a cross-sectional view of a present invention ventilation hood 10 is shown. The hood 10 has a hood body 12 which has bottom opening 14 and a top 16 of a reduced dimension. The reduced dimension top 16 provides a gas outlet for the hood 10. The bottom opening 14 is adapted for engaging an open process chamber 20, as shown in FIG. 2. It should be noted that the bottom opening 14 of the hood body 12 is normally positioned on top of a top ledge 22 of the process machine 20. The bottom opening 14 is specifically designed for a process machine such that sealing means is not required between the hood body 12 and the process machine 20.

Inside the ventilation hood 10, a fluid flow channel system 30 is mounted to an inside peripheral surface 18 of the hood body 12. The fluid flow channel 30 consists of a plurality of tubings 32 connected by connectors 34 to provide fluid communication between the various sections of the tubings 32. From the connectors 34, a plurality of fluid nozzles 36 are provided which are connected at an upper end to the connectors 34 and pointed generally downwardly toward a cavity 24 of the process chamber 20. The fluid tubings 32 can be manufactured of a chemical and corrosion resistant material such as Teflon® or stainless steel. The same material can be utilized for manufacturing the connectors 34 and the fluid nozzles 36. It is desirable that the fluid nozzles 36 are connected to the connectors 34 by universal joints (not shown) such that the direction of the purge gas flow may be adjusted as desired by repositioning the fluid nozzles 36.

Figure 3:
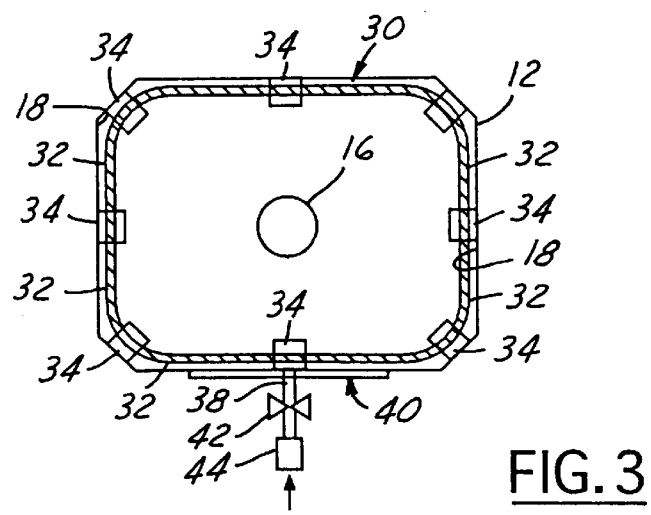
FIG. 3 is a plane view of the present invention ventilation hood showing the fluid flow channel system connected to a shut-off valve.

A plan view of the fluid flow, channel system 30 is shown in FIG. 3. The fluid tubings 32 are connected by the fluid connectors 34 which are in turn attached to an interior peripheral wall 18 of the hood body 12. It should be noted that, the fluid flow channel 30 can be arranged in any desirable pattern and not necessarily limited to the pattern shown in FIG. 3. The number of fluid nozzles utilized may be suitable selected and does not need to be eight nozzles with each connected to a connector 34. A fluid flow is fed to the fluid flow channel 30 through tubing 38, a shut-off valve 42 and a quick connector 44. The quick connector 44 for the fluid flow channel system 30 can be easily connected to a factory gas supply line, for instance, a general nitrogen supply line or a gas supply tank. The ventilation hood body 12 may further include an access door 40 for easy access to the hood interior or the chamber cavity.

Figure 4:
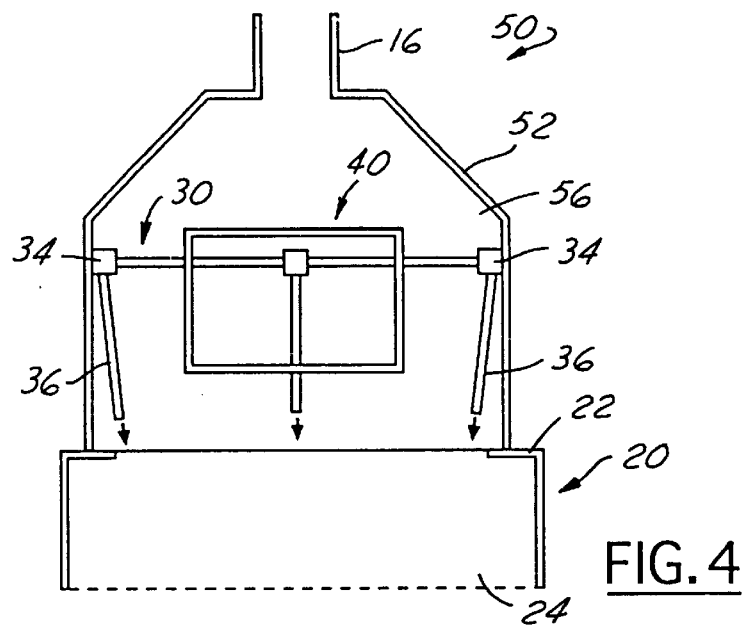
FIG. 4 is a cross-sectional view of the present invention ventilation hood in an alternate embodiment which is equipped with an access door.

FIG. 4 shows a cross-sectional view of the present invention ventilation hood in an alternate embodiment. The ventilation hood 50 further includes an access door 40 which may be used as an observation means by making the door with a substantially transparent material when the hood body 52 is made of a non-transparent material. The access door 40 may also be provided to advantageously allow a machine operator to access the hood interior 56 and the chamber cavity 24. This may be desirable when the purge gas flown from the gas nozzles 36 are insufficient to clean away the contaminants deposited on the chamber walls and thus a manual cleaning with an air gun becomes necessary.

Figure 5:
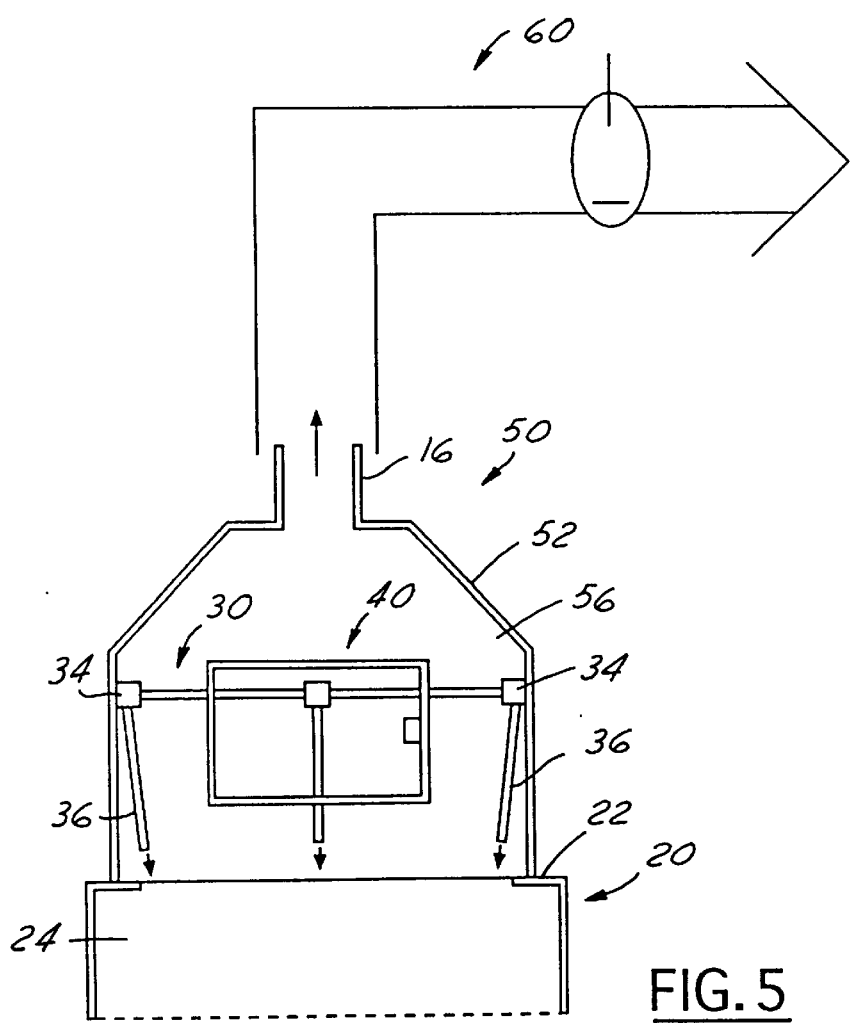
FIG. 5 is a cross-sectional view of the present invention ventilation hood in an alternate embodiment that is connected to a facility vacuum exhaust system.

FIG. 5 is a cross-sectional view of the present invention alternate embodiment ventilation hood 50 wherein a factory exhaust system 60 is connected to the reduced opening top 16 such that the purge gas flown into the chamber cavity 24 from nozzles 36 carries contaminating particles into the factory vacuum exhaust system 60. The use of the present invention novel apparatus and method therefore allows substantially all contaminating particles from a process chamber cavity be carried away from the process machine and thus insuring high quality IC devices be fabricated and a high yield of the fabrication process be achieved. It should be noted that while a chemical vapor deposition chamber for the deposition of tungsten plugs is illustrated as a specific example for the present invention preferred embodiment, the present invention novel apparatus and method can be utilized on any other process chambers that requires ventilation during or prior to a wet cleaning process. The ventilation hood may also be used in process industries other than the semiconductor processing industry.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for cleaning a process chamber comprising:
    a ventilation hood having a hood body, said body having an open bottom and a top having a reduced dimension, said open bottom being adapted to sealingly engage an open top of a process chamber,
    a fluid flow channel attached to an inner peripheral wall of said hood body equipped with a plurality of fluid nozzles pointing substantially downwardly toward said process chamber when said ventilation hood is positioned on said process chamber,
    a fluid reservoir in fluid communication with said fluid flow channel for supplying a fluid through said plurality of fluid nozzles, and
    an exhaust system in connection with said reduced opening top of the hood body for removing an effluent from said process chamber after said chamber is purged by said fluid.

2. An apparatus according to claim 1, wherein said hood body further comprises an observation means through said body.

3. An apparatus according to claim 1, wherein said hood body is substantially optically transparent.

4. An apparatus according to claim 1, wherein said process chamber is a semiconductor process chamber.

5. An apparatus according to claim 1, wherein said fluid flow channel is adapted for transporting a gas or a liquid therethrough.

6. An apparatus according to claim 1, wherein said plurality of fluid nozzles are adapted for injecting a purge gas toward said process chamber.

7. An apparatus according to claim 1, wherein said plurality of fluid nozzles are adapted for injecting a purge gas into said process chamber for transporting contaminating particles into said exhaust system.

8. An apparatus according to claim 1 further comprising a fluid shut-off device in fluid communication with and in between said fluid reservoir and said fluid flow channel.

9. A method for venting a process chamber prior to a wet cleaning process by removing an effluent containing contaminating particles comprising the steps of:
    providing a process chamber having an open top,
    providing a ventilation hood having a hood body equipped with an open bottom and a reduced opening top, a fluid flow channel attached to an inner peripheral wall of the hood body equipped with a plurality of fluid nozzles and an exhaust system in fluid communication with said reduced opening top of said hood,
    sealingly engaging said open bottom of the hood body with said open top of the process chamber, and
    flowing a fluid into said fluid flow channel through said plurality of fluid nozzles forming an effluent containing contaminating particles into said exhaust system.

10. A method according to claim 9 further comprising the step of cleaning inside walls of said process chamber with a solvent after said fluid is flown through said fluid flow channel.

11. A method according to claim 9 further comprising the step of flowing said fluid through said plurality of fluid nozzles continuously for a time period of not less than three minutes.

12. A method according to claim 9, wherein said fluid is flown through said plurality of fluid nozzles intermittently for at least three times and at least one minute each time.

13. A method according to claim 9, wherein said fluid flown through said plurality of fluid nozzles is nitrogen or compressed dry air.

14. A method according to claim 9 further comprising the step of visually observing the cleaning process through an observation means installed in said hood body.

15. A method according to claim 9 further comprising the step of opening a shut-off valve connected in fluid communication with and in between said fluid flow channel and a fluid reservoir.

16. A method according to claim 9, wherein said fluid flows through said plurality of fluid nozzles under a pressure of between about 30 psi and about 150 psi.

17. An apparatus for venting a process chamber during a chamber wet cleaning process comprising:
    a ventilation hood having a hood body, said hood body being equipped with an open bottom, a reduced opening top and an observation means,
    said open bottom being adapted for sealingly engaging an open top of said process chamber,
    a gas flow channel attached to an inner peripheral wall of said hood body equipped with a plurality of gas nozzles, a gas supply line connected to said gas flow channel for supplying a purge gas through said gas nozzles, and a gas evacuation means connected to said reduced opening top of said hood body for removing the purge gas from said process chamber.

18. An apparatus according to claim 17, wherein said observation means comprises a hood body that is substantially optically transparent.

19. An apparatus according to claim 17, wherein said purge gas is nitrogen or compressed dry air.

20. An apparatus according to claim 17 further comprising a fluid shut-off device connected in fluid communication with and in between said gas supply line and said gas flow channel.

* * * * *